United States Patent
Saeki

(10) Patent No.: US 10,043,835 B2
(45) Date of Patent: Aug. 7, 2018

(54) DISPLAY DEVICE AND METHOD FOR MANUFACTURING THE SAME

(71) Applicant: Japan Display Inc., Tokyo (JP)

(72) Inventor: Takashi Saeki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/478,458

(22) Filed: Apr. 4, 2017

(65) Prior Publication Data

US 2018/0019267 A1 Jan. 18, 2018

(30) Foreign Application Priority Data

Jul. 15, 2016 (JP) ................................. 2016-140059

(51) Int. Cl.
| | | |
|---|---|---|
| H01L 23/544 | (2006.01) | |
| H01L 27/12 | (2006.01) | |
| H01L 21/67 | (2006.01) | |
| H01L 21/687 | (2006.01) | |
| G02F 1/1333 | (2006.01) | |
| G02F 1/1345 | (2006.01) | |
| H01L 51/00 | (2006.01) | |

(52) U.S. Cl.
CPC .... *H01L 27/1262* (2013.01); *H01L 21/67092* (2013.01); *H01L 21/68757* (2013.01); *H01L 21/68778* (2013.01); *H01L 23/544* (2013.01); *H01L 27/124* (2013.01); *H01L 27/1218* (2013.01); *G02F 1/13452* (2013.01); *G02F 1/133305* (2013.01); *H01L 51/0097* (2013.01); *H01L 2223/54426* (2013.01); *H01L 2227/323* (2013.01); *H01L 2251/5338* (2013.01)

(58) Field of Classification Search
CPC ............................ H01L 23/544; H01L 27/124
USPC .......................................................... 257/797
See application file for complete search history.

(56) References Cited

U.S. PATENT DOCUMENTS

| | | | | |
|---|---|---|---|---|
| 7,230,705 B1 * | 6/2007 | Yang | ................... | G03F 7/70633 257/797 |
| 7,403,257 B2 * | 7/2008 | Shin | .................... | G02F 1/13452 349/149 |
| 8,035,238 B2 * | 10/2011 | Kim | .................... | H01L 23/4985 257/797 |
| 2002/0085154 A1 * | 7/2002 | Hattori | .................. | G02F 1/1337 349/123 |
| 2005/0186718 A1 * | 8/2005 | Yoo | ........................ | G02F 1/1345 438/151 |
| 2008/0030666 A1 * | 2/2008 | Abe | .................... | G02F 1/13452 349/150 |
| 2015/0137102 A1 * | 5/2015 | Yang | .................... | B32B 37/144 257/40 |
| 2016/0079281 A1 * | 3/2016 | Park | .................... | H01L 27/1259 257/72 |

FOREIGN PATENT DOCUMENTS

JP 2011-209405 A 10/2011

* cited by examiner

*Primary Examiner* — Nitin Parekh
(74) *Attorney, Agent, or Firm* — Typha IP LLC

(57) ABSTRACT

A method for producing a display device includes locating a substrate, including a plurality of pixels, on a jig including a magnet; locating a plate formed of a magnetic material on the substrate to secure the substrate; and folding back an end portion of the substrate in a state where the substrate is held between the jig and the plate.

7 Claims, 12 Drawing Sheets

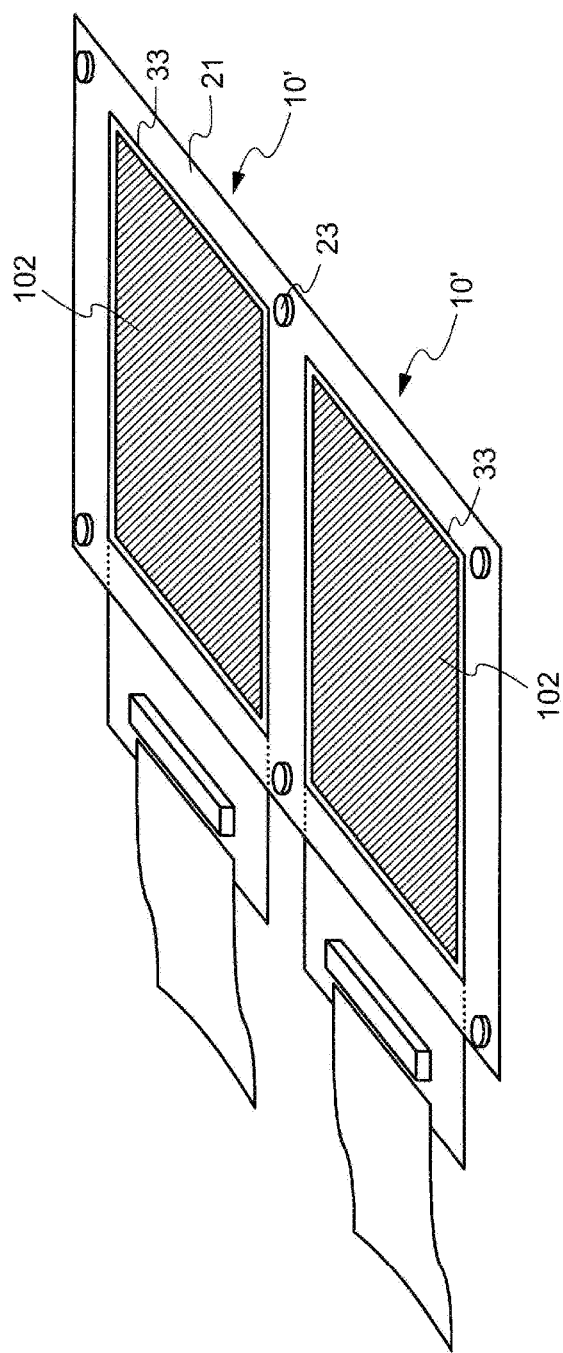

DISPLAY DEVICE AND METHOD FOR MANUFACTURING THE SAME

CROSS REFERENCE TO RELATED APPLICATIONS

This application is based on and claims the benefit of priority from the prior Japanese Patent Application No. 2016-140059, filed on 15 Jul. 2016, the entire contents of which are incorporated herein by reference.

FIELD

The present invention relates to a display device including a plurality of pixels, and specifically to a display device including a flexible substrate that is foldable.

BACKGROUND

Conventionally, as a display device such as an LCD (Liquid Crystal Display), an OLED (Organic Light Emitting Diode) display or the like, a display device including a substrate having flexibility (hereinafter, referred to as a "flexible substrate") is known. A display device, more specifically, a display panel, including a flexible substrate is entirety flexible and is foldable, and therefore, is usable in a very wide range.

A display including a flexible substrate has an advantage that the size of a bezel may be decreased. For example, Japanese Laid-Open Patent Publication No. 2011-209405 discloses a display device in which a flexible substrate is folded at a wiring portion connecting a pixel array portion and a peripheral circuit portion to each other, so that the peripheral circuit portion is located on a rear surface of the pixel array portion. This allows a bezel of the display device to be narrower, and thus the display device is decreased in size.

SUMMARY

A method for producing a display device in an embodiment according to the present invention includes locating a substrate, including having a plurality of pixels, on a jig including a magnet; locating a plate formed of a magnetic material on the substrate to secure the substrate by a magnetic force; and folding back an end portion of the substrate in a state where the substrate is held between the jig and the plate. The end portion of the substrate may be folded with a spacer being held inside.

A display device in an embodiment according to the present invention includes a substrate including a portion folded back with a first surface of the substrate being an inner surface; a plurality of pixels provided on a second surface opposite to the first surface of the substrate; and a first marker and a second marker provided on the second surface so as to overlap each other as seen in a plan view. The display device may include a spacer provided at a position along which the substrate is folded with the first surface being an inner surface.

BRIEF EXPLANATION OF DRAWINGS

FIG. 12 is a perspective view showing how an organic EL display device is inspected in embodiment 2.

DESCRIPTION OF EMBODIMENTS

Figure 1:
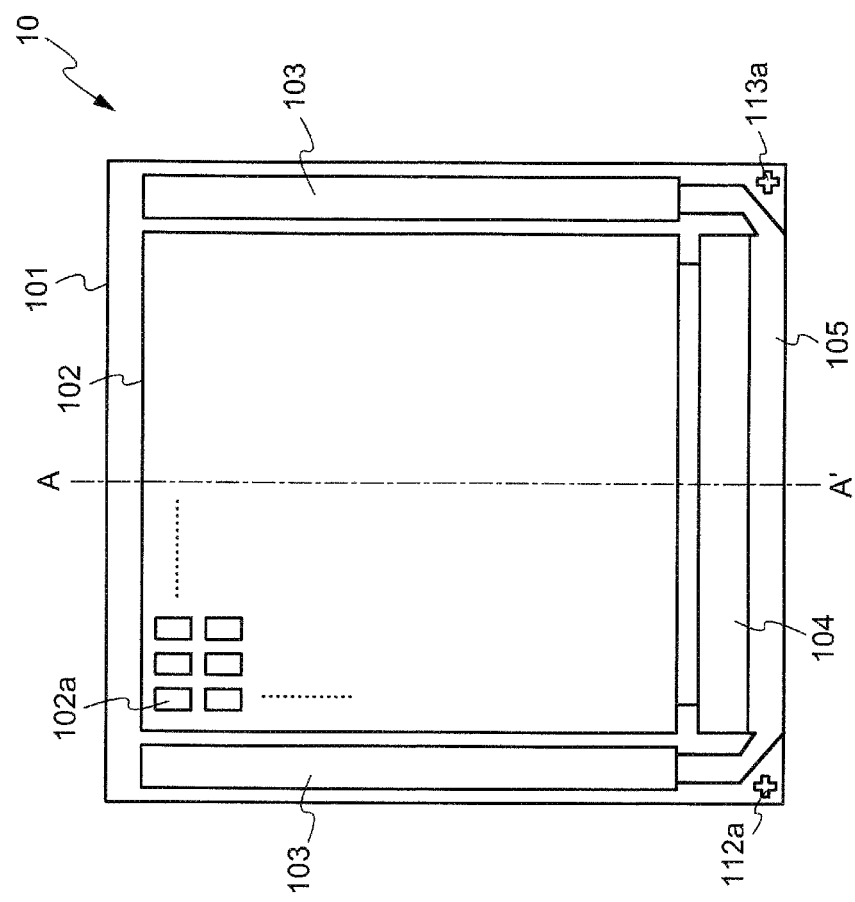
FIG. 1 is a plan view showing a structure of an organic EL display device in embodiment 1.

Japanese Laid-Open Patent Publication No. 2011-209405 described above discloses that the flexible substrate is folded at about 180 degrees along the wiring portion. In this case, unless the flexible substrate is folded at an accurate position, the wires may be broken. However, the display device is often warped while being manufactured, and it is difficult to fold the substrate at an accurate position because of the warp.

An object of the present invention is to improve the folding precision of a display device including a flexible substrate.

Hereinafter, embodiments of the present invention will be described with reference to the drawings. The present invention may be carried out in various forms without departing from the gist thereof, and is not to be construed as being limited to any of the following embodiments.

In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, an expression that a component is "on" another component encompasses a case where such a component is in contact with another component and also a case where such a component is above or below another component, namely, a case where still another component is provided between such a component and another component, unless otherwise specified.

In this specification, in the case where the expression that "α includes A, B or C", "α includes any of A, B and C", "α includes one selected from the group consisting of A, B and C" or the like is provided, such an expression does not exclude a case where α includes any combination of A through C unless otherwise specified. Such an expression does not exclude, either, a case where α includes any other element.

Embodiment 1

<Structure of the Display Device>

Figure 2:
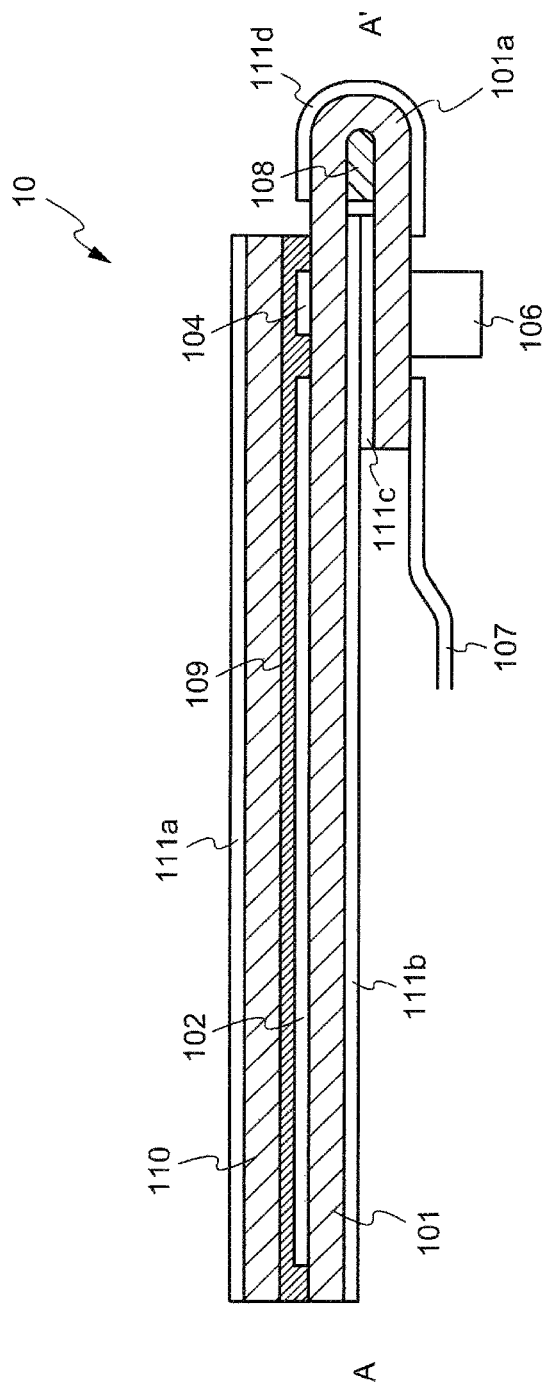
FIG. 2 is a cross-sectional view showing the structure of the organic EL display device in embodiment 1.

FIG. 1 is a plan view showing a structure of an organic EL (electroluminescence) display device 10 in embodiment 1. FIG. 2 is a cross-sectional view showing the structure of the organic EL display device 10 in embodiment 1. Specifically, FIG. 2 is a cross-sectional view of the organic EL display device 10 in FIG. 1 taken along line A-A in FIG. 1. In this embodiment, the organic EL display device 10 is described as an example of display device. The present invention is applicable to other display devices.

The organic EL display device 10 in this embodiment includes a flexible substrate 101 formed of a resin material, and also includes a display circuit 102 as a display region, a scanning line driving circuit 103, a signal line driving circuit 104, a wiring portion 105, a logic circuit 106, and a flexible printed circuit 107, which are provided on the flexible substrate 101.

The flexible substrate 101 is formed of a resin material and is flexible. Examples of the usable resin material include polyimide, acrylic resin, PET (poly (ethylene terephthalate)) and the like. Any material other than these materials that is appropriate as a material of a flexible substrate is usable.

The display circuit 102 includes a plurality of pixels 102a located on a surface of the flexible substrate 101. More specifically, the plurality of pixels 102a arrayed in a row direction and a column direction form the display circuit 102 acting as a region displaying an image. The pixels 102a each include a thin film transistor as a semiconductor device and an organic EL (electroluminescence) element as a display element.

The scanning line driving circuit 103 is connected with a plurality of scanning lines extending in the row direction (lateral direction in FIG. 1). The signal line driving circuit 104 is connected with a plurality of signal lines extending in the column direction (vertical direction in FIG. 1). The plurality of pixels 102a are located in correspondence with positions at which the plurality of scanning lines and the plurality of signal lines cross each other. During the manufacturing of the organic EL display device 10 in this embodiment, the scanning line driving circuit 103 and the signal line driving circuit 104 are formed by use of a thin film transistor at the same time as the pixels 102a.

The wiring portion 105 includes a plurality of lines connecting the scanning line driving circuit 103 and the signal line driving circuit 104 with the logic circuit 106. As described below, in this embodiment, the wiring portion 105 is used as a position at which the flexible substrate 101 is folded.

The logic circuit 106 is a circuit outputting a predetermined control signal and a predetermined data signal to the scanning line driving circuit 103 and the signal line driving circuit 104. Specifically, the logic circuit 106 may be an integrated circuit such as an ASIC (Application Specific Integrated circuit) or the like. In this embodiment, the logic circuit 106 is used to control both of the scanning line driving circuit 103 and the signal line driving circuit 104. Alternatively, either one of, or both of, the scanning line driving circuit 103 and the signal line driving circuit 104 may be replaced with the logic circuit 106.

The flexible printed circuit 107 is a circuit usable as a terminal transmitting and receiving signals between the logic circuit 106 and an external circuit (not shown). The flexible printed circuit 107 includes a flexible resin substrate and a plurality of lines provided on the resin substrate. The flexible printed circuit 107 is bonded to the flexible substrate 101 and is electrically connected with the logic circuit 106. The logic circuit 106 may be located on the flexible printed circuit 107.

In the organic EL display device 10 in this embodiment, a part of the flexible substrate 101 is folded back to overlap the rest of the flexible substrate 101. Specifically, as shown in FIG. 2, among surfaces of the flexible substrate 101, a surface on which the plurality of pixels 102a are provided is set as a front surface, and a surface opposite thereto is set as a rear surface. The flexible substrate 101 is folded at the position of the wiring portion 105 (see FIG. 1) such that the rear surface is an inner surface.

Therefore, in the case where the organic EL display device 10 in this embodiment is seen from a side surface thereof, the logic circuit 106 and the flexible printed circuit 107 are located on a rear surface of the display circuit 102. Namely, an end portion of the flexible substrate 107 is folded back, so that the logic circuit 106 and the flexible printed circuit 107 are located on the rear surface of the display circuit 102. Thus, the organic EL display device 10 is entirely decreased in size.

As described below, in this embodiment, the flexible substrate 101 is folded with a spacer 108 being held inside. Thus, the organic EL display device 10 includes the spacer 108 inner to a folded portion 101a. The spacer 108 is provided in order to prevent the lines from being broken in the wiring portion 105, at which the flexible substrate 101 is folded. Namely, the spacer 108 plays a role of keeping a minimum radius of curvature at a constant value (e.g., r=0.5 mm) when the flexible substrate 101 is folded.

The organic EL display device 10 in this embodiment further includes a sealing layer 109 and a protective substrate 110 provided on the front surface of the flexible substrate 101 so as to cover the display circuit 102, the scanning line driving circuit 103 and the signal line driving circuit 104. The sealing layer 109 is formed of a resin such as polyimide, acrylic resin or the like. The protective substrate 110 is formed of a resin material substantially the same as that of the flexible substrate 101. The sealing layer 109 and the protective substrate 110 both play a role of protecting the display circuit 102, the scanning line driving circuit 103 and the signal line driving circuit 104 against external moisture or impact. If the sealing layer 109 is sufficient to protect the display circuit 102, the scanning line driving circuit 103 and the signal line driving circuit 104 against external moisture or impact, the protective substrate 110 may be omitted.

The organic EL display device 10 in this embodiment further includes protective films 111a through 111d protecting the surfaces of the flexible substrate 101 and the protective substrate 110. The protective film 111a protects a front surface (surface on the side of the viewer) of the protective substrate 110. The protective films 111b and 111c protect the rear surface of the flexible substrate 101. The protective film 111d protects the front surface of the flexible substrate 101.

As shown in FIG. 2, the protective films 111b and 111c are located at different positions while having the spacer 108 therebetween. For example, the protective film 111b covers substantially the entirety of the rear surface of the flexible substrate 101. The protective film 111c covers a part of the rear surface of the flexible substrate 101 that is on the side of a tip (end) thereof with respect to the folded portion 101a.

Such an arrangement prevents, in a state where the flexible substrate 101 is folded, direct contact between the two folded parts of the rear surface of the flexible substrate 101.

The protective film 111d is provided in order to protect a part of the front surface of the flexible substrate 101 that is exposed outside (in this embodiment, the wiring portion 105) and also to control the position of a neutral face in the state where the flexible substrate 101 is folded. Herein, the "neutral face" is a face at which in a state where a stacked body is folded, the compression strain and the tensile strain are in equilibrium. In this embodiment, the protective film 111d is provided on a stacked body including the flexible substrate 101 and the wiring portion 105 in an intention to match a layer in which the neutral face is located to a layer in which the wiring portion 105 is located. With such an arrangement, when the flexible substrate 101 is folded, the neutral face is located at the position of the lines included in the wiring portion 105. Therefore, the risk that the lines are broken by the strain caused by the stress is alleviated.

As shown in FIG. 1, the organic EL display device 10 in this embodiment includes alignment markers (markers for positional alignment) 112a and 113a in a region of the flexible substrate 101 other than the display circuit 102 (region including the plurality of pixels 102a). The alignment markers 112a and 113a play an important role in a process of manufacturing the organic EL display device 10 described below. This will be described in detail below regarding the method for manufacturing the organic EL display device 10.

<Method for Manufacturing the Organic EL Display Device>

Figure 3:
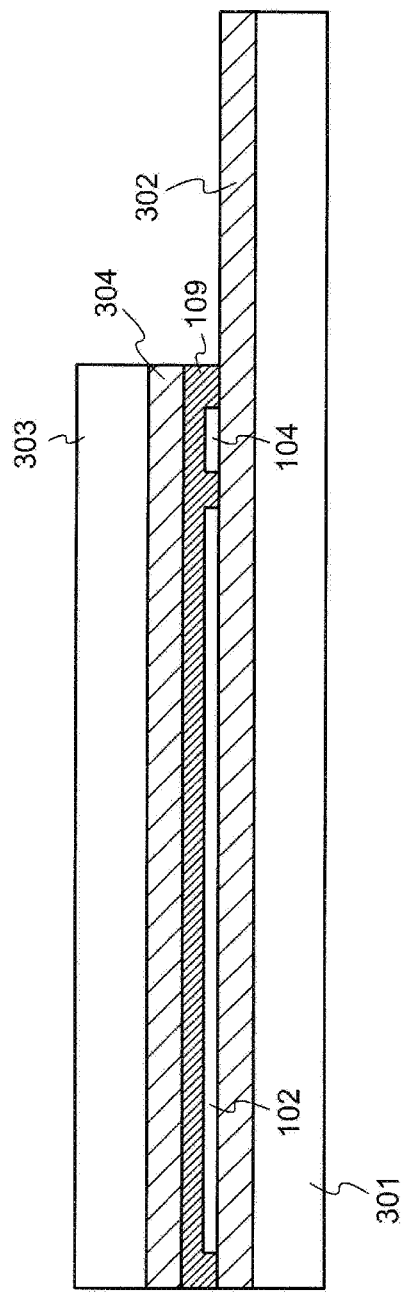
FIG. 3 is a cross-sectional view showing a method for manufacturing the organic EL display device in embodiment 1.

A method for manufacturing the organic EL display device 10 in this embodiment will be described. First, as shown in FIG. 3, a first resin layer 302 is formed on a first support substrate 301 formed of glass or the like. The first resin layer 302 is a layer acting as the flexible substrate 101 after the first support substrate 301 is removed.

Next, the display circuit 102 and the signal line driving circuit 104 are formed on the first resin layer 302 by a conventionally known thin film transistor production method. Although not shown in FIG. 3, the scanning line driving circuit 103 and the wiring portion 105 are also formed on the first resin layer 302 at the same time as the display circuit 102 and the signal line driving circuit 104. The alignment markers 112a and 113a shown in FIG. 1 may be formed during the formation of the display circuit 102 and the signal line driving circuit 104 by the thin film transistor production method. The signal line driving circuit 104 and/or the scanning line driving circuit 103 does not need to be formed on the first resin layer 302 in this step. In the case where not being formed on the first resin layer 302 in this step, the signal line driving circuit 104 or the scanning line driving circuit 103 is mounted as a part of the logic circuit 106 in a later step.

After the display circuit 102 and the signal line driving circuit 104 are formed, the sealing layer 109 formed of a resin material is used to bond a second support substrate 303 and a second resin layer 304 to the first resin layer 302. Specifically, the second resin layer 304 is formed on the second support substrate 303 separately in advance, and the assembly of the second support substrate 303 and the second resin layer 304 is bonded to the first resin layer 302 such that the first resin layer 302 and the second resin layer 304 face each other while having the sealing layer 109 therebetween.

Figure 4:
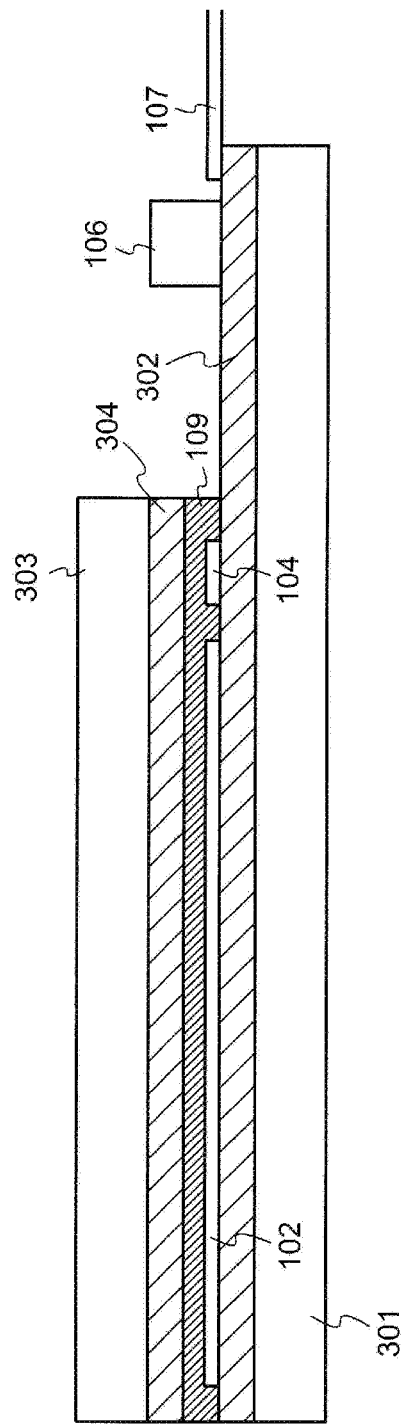
FIG. 4 is a cross-sectional view showing the method for manufacturing the organic EL display device in embodiment 1.

Next, as shown in FIG. 4, the logic circuit 106 and the flexible printed circuit 107 are located on the first resin layer 302. Specifically, a terminal to be electrically connected with the wiring portion 105 (see FIG. 1) is already provided on the first resin layer 302, and the logic circuit 106 and the flexible printed circuit 107 are connected with the terminal.

Figure 5:
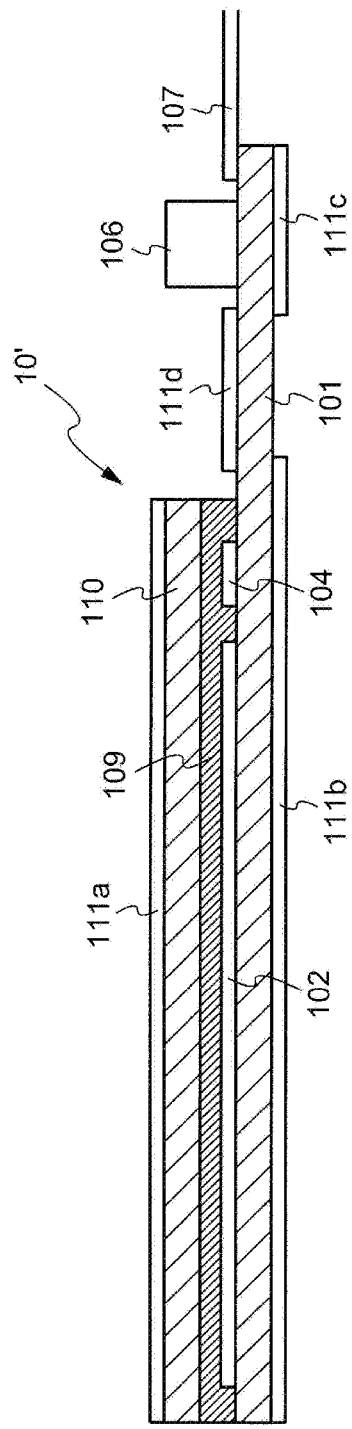
FIG. 5 is a cross-sectional view showing the method for manufacturing the organic EL display device in embodiment 1.

Next, the first support substrate 301 and the second support substrate 303 are removed to expose the first resin layer 302 and the second resin layer 304. The first support substrate 301 and the second support substrate 303 may be removed by directing laser light toward an interface between the first support substrate 301 and the first resin layer 302 and to an interface between the second support substrate 303 and the second resin layer 304. Regarding steps after this, as shown in FIG. 5, the first resin layer 302, from which the first support substrate 301 has been removed, will be referred to as the "flexible substrate 301", and the second resin layer 304, from which the second support substrate 303 has been removed, will be referred to as the "protective substrate 110".

After the first support substrate 301 and the second support substrate 303 are completely removed, the protective films 111a through 111d are bonded at corresponding positions of the flexible substrate 101 and the protective substrate 110. With such a manufacturing process, a flexible substrate 10' including the plurality of pixels 102a is formed. In other words, the flexible substrate 10' is a pre-folding organic EL display device 10 excluding the spacer.

Next, the flexible substrate 10' including the plurality of pixels 102a is folded. Specifically, the flexible substrate 10' is held and secured between a jig 21 including a magnet described below and a plate formed of a magnetic material (hereinafter, referred to as a "magnetic plate") 31, and a part of the flexible substrate 10' is folded back. As a result, a portion of the flexible substrate 10' including the logic circuit 106, the flexible printed circuit 107 and the like is folded back to face the rear surface of the display circuit 102.

Figure 6:
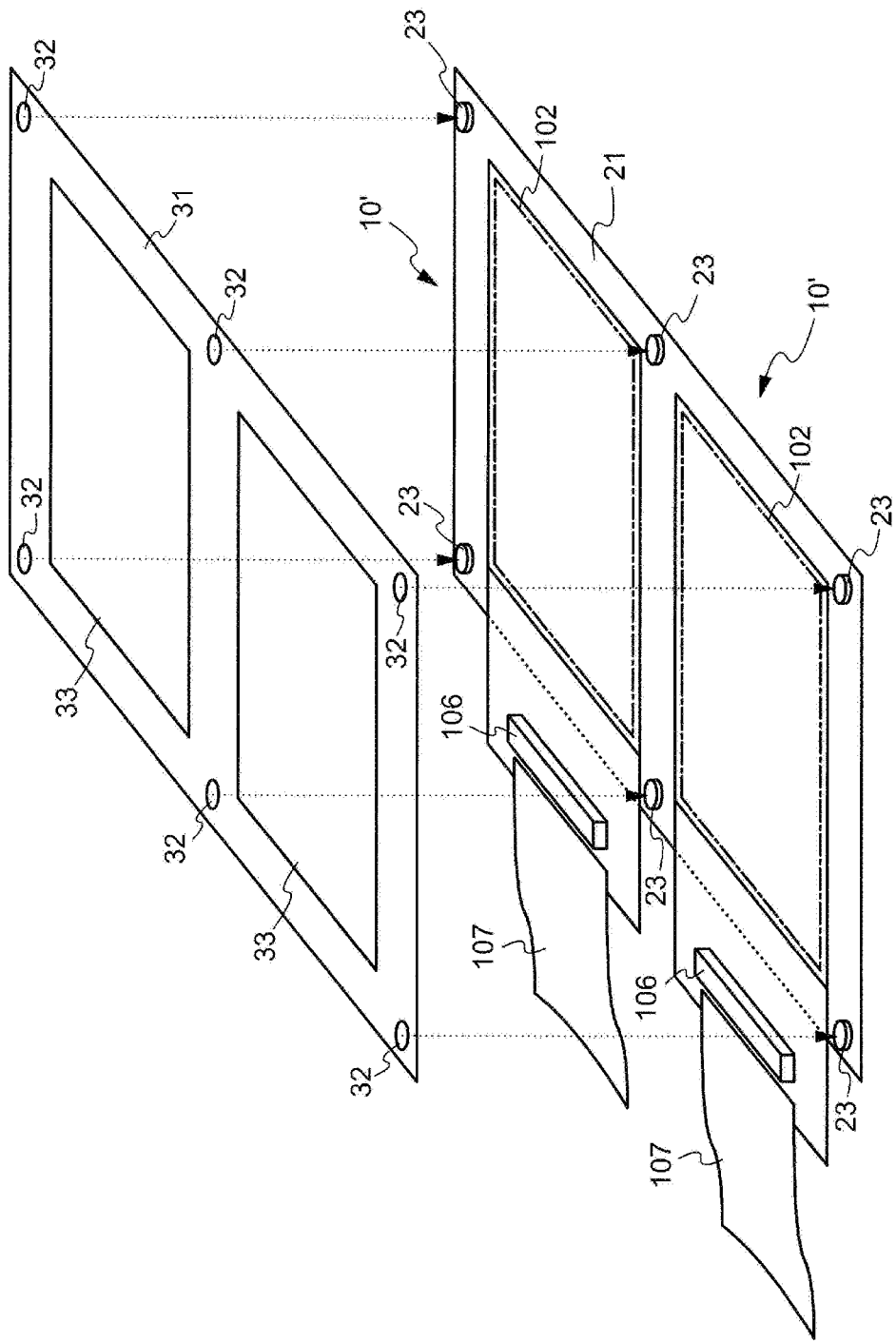
FIG. 6 is a perspective view showing how the organic EL display device in embodiment 1 is folded.

As shown in FIG. 6, in this embodiment, the flexible substrates 10' including the plurality of pixels 102a are put on the jig 21. In this embodiment, two flexible substrates 10' are put on the jig 21. There is no specific limitation on the number of the flexible substrate(s) 10'. The jig 21 may be formed of a magnet or a metal plate having a magnetic force. In either case, the jig 21 may be formed of a material capable of securing the magnetic plate 31 described below by a magnetic force.

Figure 7:
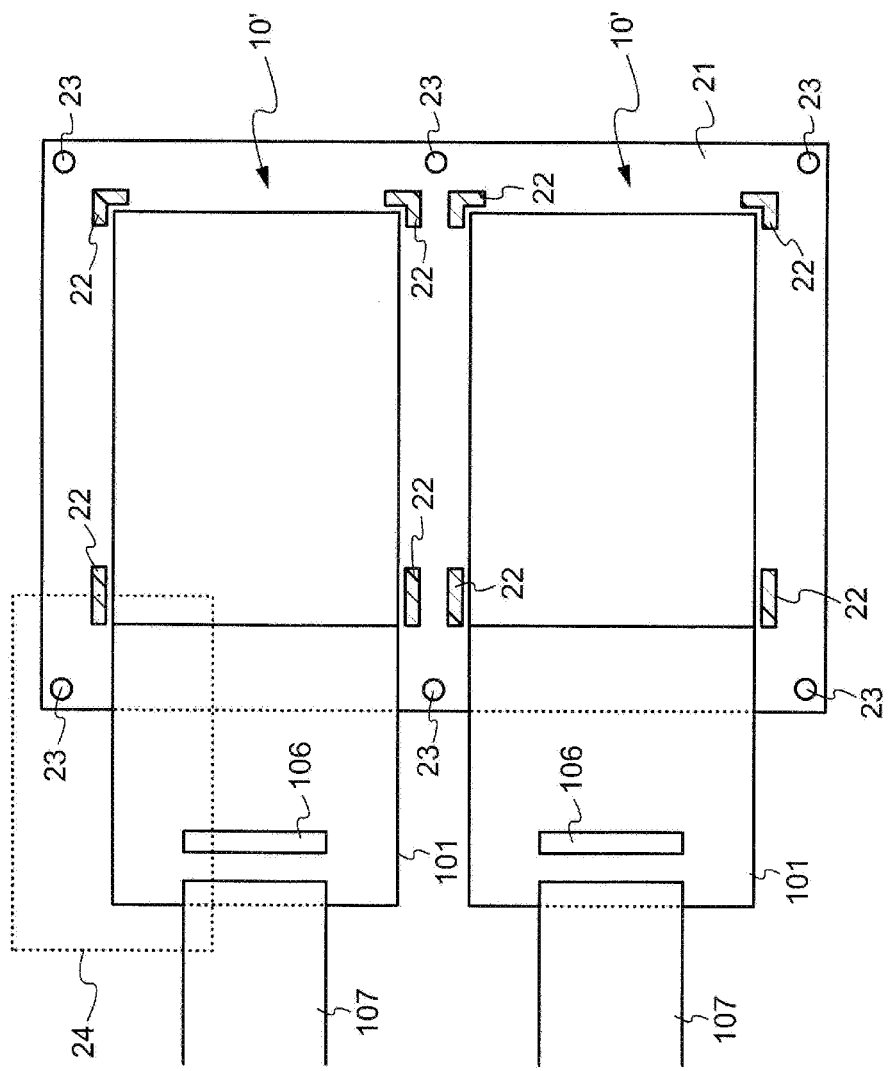
FIG. 7 is a plan view showing a structure of a jig used to fold the organic EL display device in embodiment 1.

As shown in FIG. 7, the jig 21 in this embodiment is equipped with markers 22 showing positions at which the flexible substrate 10' is to be located. The markers 22 may be formed on the jig 21 by any method by which the markers 22 are easily visually recognizable, for example, printing, sealing, marking-off, or the like. Instead of the markers 22, the jig 21 may have recessed portions at which the flexible substrate 10' is to be located, so that the flexible substrate 10' are partially fit into the recessed portions. Needless to say, the recessed portions may be provided in the magnetic plate 31.

In this embodiment, the flexible substrate 10' is located while being positionally aligned by use of the markers 22 or the recessed portions. The alignment precision may be relatively low. A reason for this is that as described below, it is sufficient that the flexible substrate 10' is secured by the jig 21 and the magnetic plate 31.

Returning to FIG. 6, the jig 21 includes protrusions 23 at ends thereof. The magnetic plate 31 has holes 32 formed at ends thereof. The protrusions 23 and the holes 32 are located at corresponding positions to each other. The jig 21 and the magnetic plate 31 are stacked and assembled together such that the protrusions 23 are inserted into the holes 32. Namely, the protrusions 23 and the holes 32 are used for positional alignment for bonding the jig 21 and the magnetic plate 31 to each other and also to secure the jig 21 and the magnetic plate 31 with respect to each other after the bonding.

The magnetic plate 31 in this embodiment has openings 33 formed therein. The openings 33 are provided at positions at which the display circuits 102 (represented by one-dot chain line) of the flexible substrates 10' located on the jig 21 are to be exposed. Therefore, in this embodiment, even after the jig 21 and the magnetic plate 31 are bonded together, the display circuits 102 are visually recognized. The magnetic plate 31 may not need to have the openings 33.

As described above, after the flexible substrates 10' are located on the jig 21, the magnetic plate 31 is located on the flexible substrates 10' while the protrusions 23 and the holes 32 are positionally aligned with each other. In this manner, the flexible substrates 10' are secured by a magnetic force. In this embodiment, the flexible circuits 10' are secured in this manner by a magnetic force, and then a part of each of the flexible circuits 10' is folded back. Thus, the flexible circuits 10' are folded in a state where the warping thereof is corrected. This allows the positional alignment described below performed by use of alignment markers to be conducted with high precision.

Figure 8:
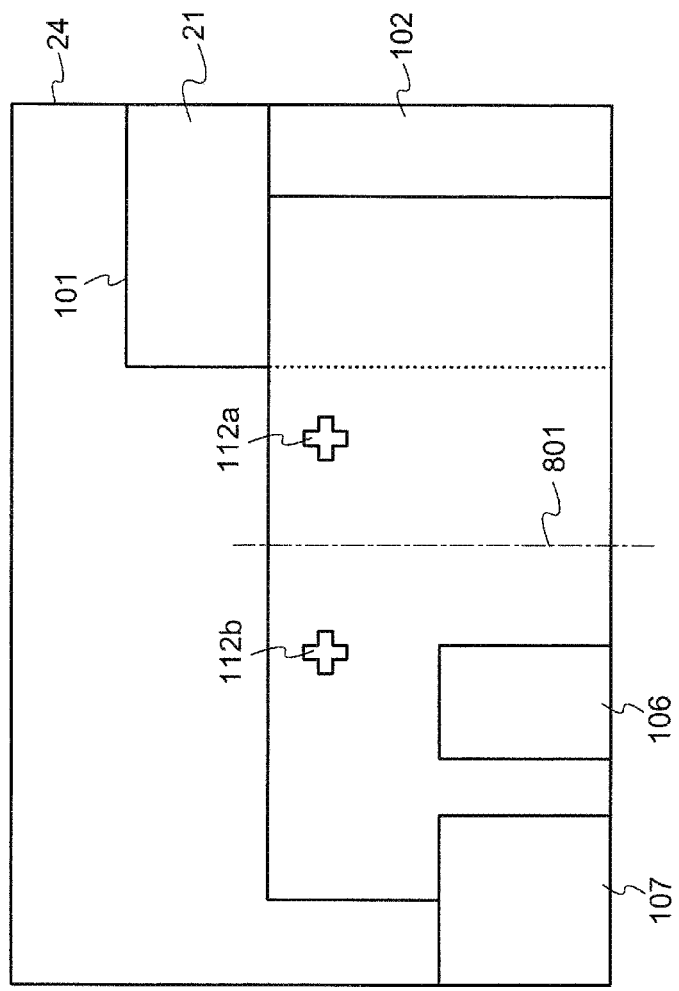
FIG. 8 is an enlarged view showing a structure of a part of the organic EL display device in embodiment 1.

Now, a structure of the folding position of each flexible substrate 10' and the vicinity thereof will be described. FIG. 8 is an enlarged view of a part of FIG. 7 enclosed by frame 24. As shown in FIG. 8, the flexible substrate 10' includes alignment markers 112a and 112b, which are line-symmetrical with respect to a folding position 801 of the flexible substrate 10'.

Although not shown in FIG. 8, the flexible substrate 10' also includes two alignment markers that are line-symmetrical with respect to the folding position 801 at an opposite end of the flexible substrate 10' (on the side of the alignment marker 113a in FIG. 1). As can be seen, in this embodiment, the flexible substrate 10' includes at least four alignment markers that are line-symmetrical with respect to the folding position 801. For simpler explanation, the description below will be made on the alignment markers 112a and 112b.

In this embodiment, four alignment markers are used. The number of the alignment markers is not limited to four. The positional alignment is performed as long as at least a pair of alignment marker are provided.

The alignment markers 112a and 112b may be formed during the manufacturing of thin film transistors included in the display circuit 102 or the like, by use of a thin film used for the thin film transistors or the like. It is desirable that the alignment markers 112a and 112b are formed in a region other than the display circuit 102 (region including the plurality of pixels 102a). It is desirable that at least one of the alignment markers 112a and 112b includes a metal layer in order to improve the visual recognizability thereof. The alignment markers 112a and 112b are not limited to being cross-shaped as shown in FIG. 8 and may have any shape as long as the alignment markers 112a and 112b act as a pair of markers for positional alignment.

In this embodiment, a part of the flexible substrate 10' is folded back along the folding position 801 such that the rear surface of the flexible substrate 10' is an inner surface (see FIG. 2). In this step, an end portion of the flexible substrate 10' is folded back while being positionally aligned by use of the alignment markers 112a and 112b provided at different positions from each other. In this manner, the flexible substrate 10' is folded with high precision. In this embodiment, the flexible substrate 10' may be folded such that the alignment markers 112a and 112b overlap each other as seen in a plan view, so that the flexible substrate 10' is folded with high precision.

Figure 9:
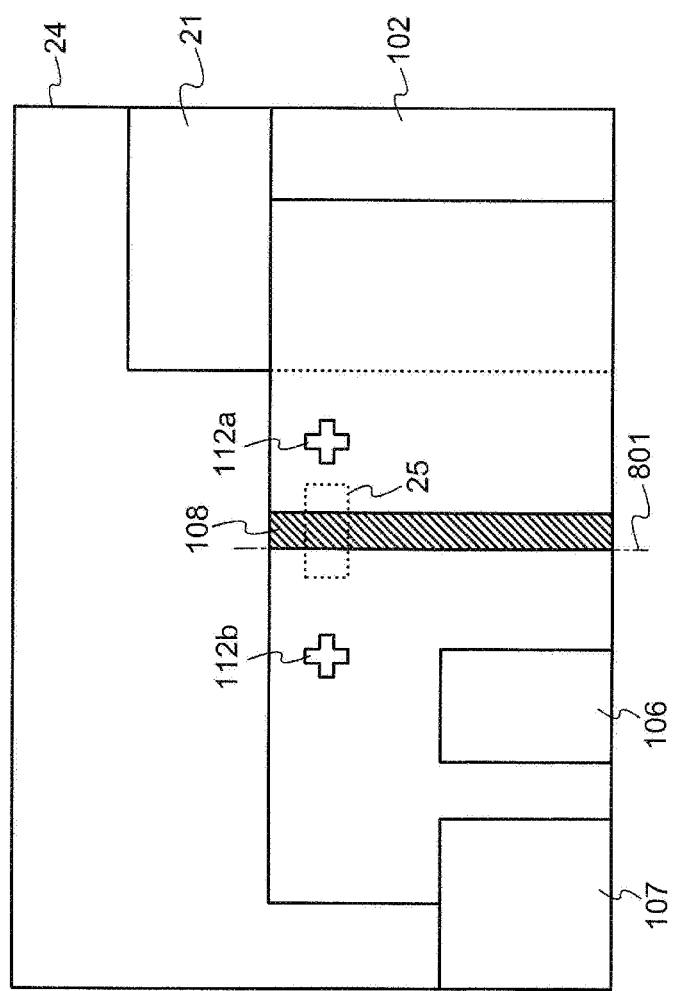
FIG. 9 is an enlarged view showing a structure of a part of the organic EL display device in embodiment 1.
Figure 10:
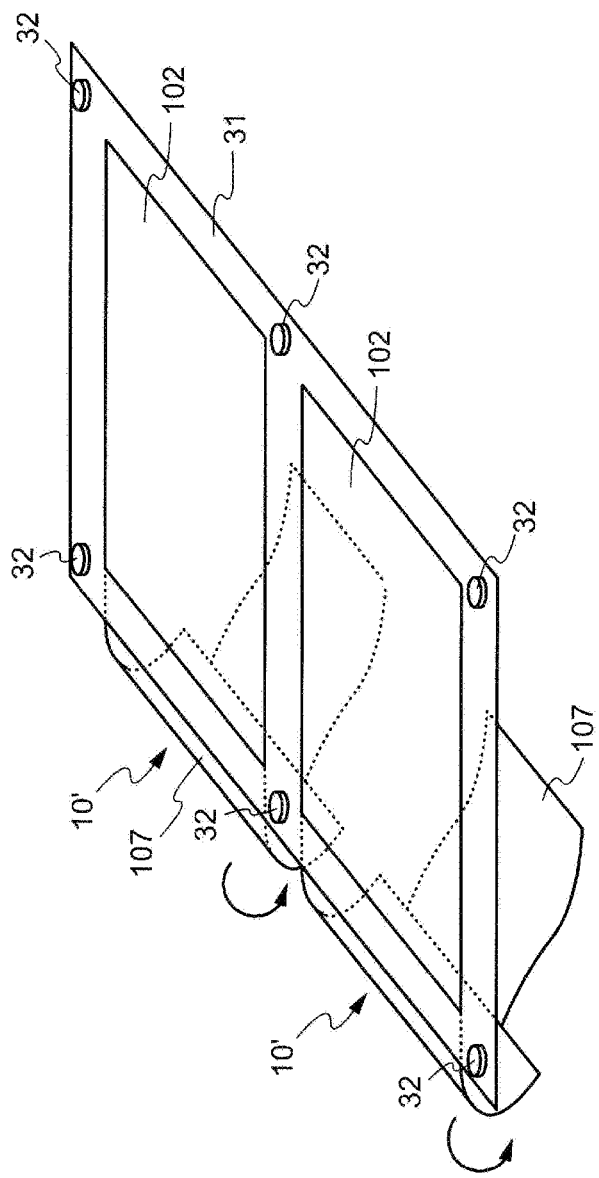
FIG. 10 is a perspective view showing how the organic EL display device in embodiment 1 is folded.

As shown in FIG. 9, in this embodiment, before the flexible substrate 10' is folded, the spacer 108 is located on the rear surface of the flexible substrate 10'. In FIG. 9, the surface visible to the viewer of FIG. 9 is the front surface of the flexible substrate 10', and the surface opposite to the front surface (surface not visible to the viewer of FIG. 9) is the rear surface of the flexible substrate 10'. In FIG. 9, the spacer 108 is located on the surface opposite to the front surface. As shown in FIG. 10, the flexible substrate 10' is folded such that a portion of the flexible substrate 10' including the logic circuit 106 and the printed circuit 107 is located on the rear surface of the rest of the flexible substrate 10'. As a result, the organic EL display device 10 shown in FIG. 2 is formed.

As described above, in the method for manufacturing the organic EL display device 10 in this embodiment, the flexible substrate 10' including the plurality of pixels 102a is secured by a magnetic force by use of the jig 21 including a magnet and the magnetic plate 31, and then a part of the flexible substrate 10' is folded back (specifically, the end portion including the logic circuit 106 and the printed circuit 107 is folded back). This allows the flexible substrate 10' to be folded with the warp thereof being corrected, and thus the folding precision is improved.

In this embodiment, the pair of alignment markers 112a and 112b are provided symmetrically with respect to the folding position 801, and the flexible substrate 10' is folded while being positionally aligned by use of the alignment markers 112a and 112b. This further improves the folding precision by a synergistic effect with the above-described correction of the warp of the flexible substrate 10' realized by the magnetic force.

The above-described effect is effective for folding the flexible substrate 10' with the spacer 108 being held inside as in this embodiment. The improved folding precision prevents the position of the spacer 108 from being shifted. Thus, an inconvenience that a sufficient radius of curvature is not obtained and as a result, the lines are broken is avoided.

(Modification)

Figure 11:
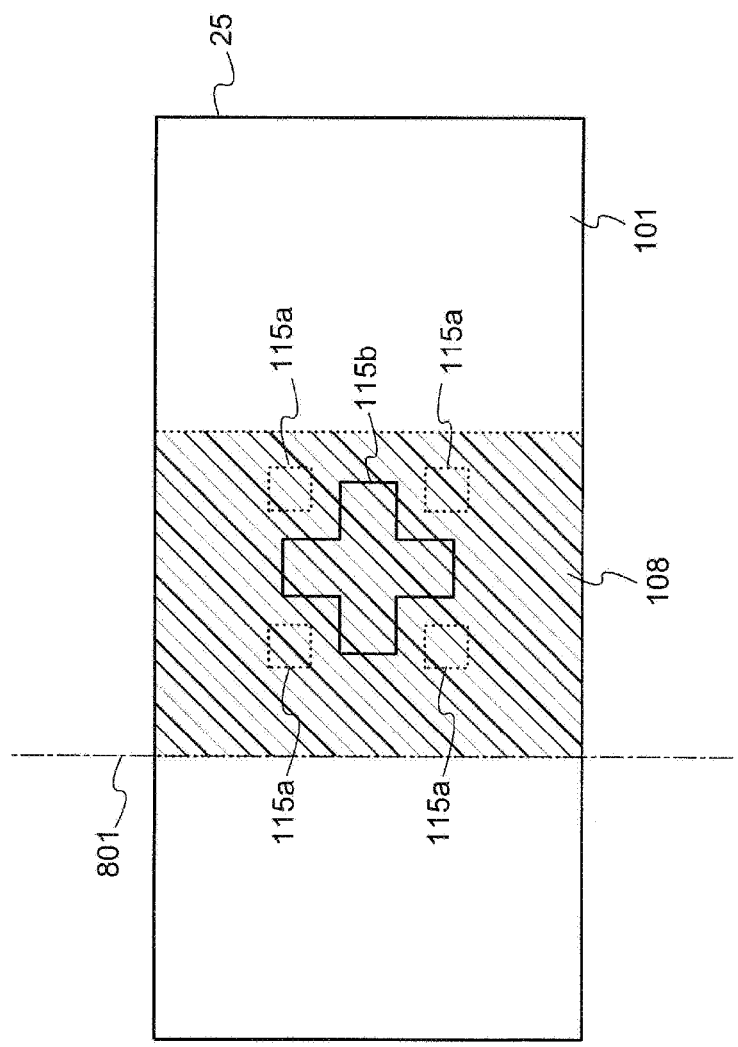
FIG. 11 is an enlarged view of a part of an organic EL display device in a modification of embodiment 1.

In the method for manufacturing the organic EL display device 10 in this embodiment, the flexible substrate 10' and the spacer 108 may be positionally aligned with each other. FIG. 11 is an enlarged view of a portion of the flexible substrate 10' enclosed by frame 25 in FIG. 9. As shown in FIG. 11, the flexible substrate 10' includes an alignment marker 115a different from the alignment marker 112a or 112b.

In this modification, the alignment marker 115a is a set of four quadrangular markers. The spacer 108 has an alignment marker 115b for the spacer 108 provided thereon. In this modification, the alignment markers 115a and 115b act as a pair of alignment markers to positionally align the flexible substrate 10' and the spacer 108 with each other.

For bonding the spacer 108 to the rear surface of the flexible substrate 10' with an adhesive layer being provided therebetween, the positional alignment is performed by use of the alignment markers 115a and 115b. This further improves the folding precision.

Embodiment 2

In embodiment 1, the method for manufacturing the organic EL display device 10 is described in detail. The method may include an inspection step. More specifically, the jig 21 including a magnet and the plate 31 formed of a magnetic material that are described in embodiment 1 may be used for an inspection step on the organic EL display device 10.

FIG. 12 is a perspective view showing an inspection step on the organic EL display device 10 in embodiment 2. In FIG. 12, the flexible substrates 10' described in embodiment 1 (i.e., the pre-folding organic EL display device excluding the spacer) are located while being held between the jig 21 and the magnetic plate 31. In this state, the display circuits 102 in the flexible substrate 10' are exposed by the openings 33 formed in the magnetic plate 31.

Therefore, in this embodiment, the display circuit 102 is inspected in a state where the warp of the flexible substrate 10' is corrected. The method for manufacturing the organic EL display device 10 in this embodiment realizes a higher precision inspection step.

In this embodiment, the display circuit 102 of the organic EL display device 10 is inspected. Alternatively, the position of the opening 33 may be changed to inspect any other circuit such as the scanning line driving circuit 103, the signal line driving circuit 104 or the like.

In this embodiment, an organic EL display device 10 is described as an example of display device. The present invention is applicable to any flat panel display device, for example, a self-light emission display device other than an organic EL display device, a liquid crystal display device, an electronic paper-type display device including an electrophoretic element, or the like. The present invention is applicable to any size of display device from a middle or small display device to a large display device.

The above-described embodiments and modifications may be optionally combined as long as no contradiction occurs. The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being provided by the present invention.

What is claimed is:

1. A display device, comprising:
   a substrate including a first portion folded back with a first surface of the substrate being an inner surface;
   a plurality of pixels provided in a second portion as a display region on a second surface opposite to the first surface of the substrate;
   a first marker and a second marker provided on the substrate so as to be aligned with each other as seen in a plan view;
   a spacer at a position along which the substrate is folded with the first surface being an inner surface;
   a third marker provided on the substrate; and
   a fourth marker provided on the spacer, wherein
   the spacer is located at a position overlapping the third marker in a plan view,
   the third marker and the fourth marker are aligned with each other in a plan view,
   the substrate includes the second portion, a third portion, a fourth portion, and a fifth portion,
   in a plan view, the second portion is arranged between the first portion and the fourth portion, and is arranged between the third portion and the fifth portion,
   in a plan view, the display device has a first side having a first length in the first portion, a second side having a second length in the third portion, a third side having a third length in the fourth portion, and a fourth side having a fourth length in the fifth portion,
   the first portion is connected to an IC driver and a circuit board,
   the IC driver has a fifth side which extends along the first side and has a fifth length,
   the circuit board has a sixth side which extends along the first side and has a sixth length,
   the fifth length is shorter than the first length,
   the sixth length is shorter than the first length,
   the second side extends in a first direction,
   the first portion has a first region and a second region,
   both the first region and the second region do not overlap the sixth side as seen along the first direction, and
   the third marker and the fourth marker are arranged in the first region in a plan view.

2. The display device according to claim 1, wherein the first marker and the second marker are provided in a region other than a region where the plurality of pixels are provided.

3. The display device according to claim 1, wherein at least one of the first marker and the second marker includes a metal layer provided on the second surface.

4. The display device according to claim 1, further comprising an adhesive layer provided between the third marker and the fourth marker provided on the spacer.

5. The display device according to claim 1, further comprising a fifth marker provided on the substrate; and
   a sixth marker provided on the spacer, wherein
   the IC driver is arranged between the first region and the second region,
   the fifth marker and the sixth marker are aligned with each other in a plan view, and
   the fifth marker and the sixth marker are arranged in the second region.

6. The display device according to claim 5, further comprising a seventh marker provided on the substrate; and
   an eighth marker provided on the substrate, wherein
   the second portion has a seventh side along the first side, an eighth side along the second side, a ninth side along the third side, and a tenth side along the fourth side in a plan view,
   the seventh side has a seventh length being longer than the fifth length and being shorter than the first length,
   both the first region and the second region overlap the seventh side as seen along the first direction,
   the first marker and the second marker are arranged in the first region in a plan view,
   the seventh marker and the eighth marker are provided on the substrate so as to be aligned with each other in a plan view, and
   the seventh marker and the eighth marker are arranged in the second region in a plan view.

7. The display device according to claim 6, wherein
   the first marker, the second marker, the third marker and the fourth marker are aligned along the first direction, and
   the fifth marker, the sixth marker, the seventh marker and the eighth marker are aligned along the first direction.

* * * * *